(12) United States Patent
Belyansky et al.

(10) Patent No.: US 10,170,582 B1
(45) Date of Patent: Jan. 1, 2019

(54) UNIFORM BOTTOM SPACER FOR VERTICAL FIELD EFFECT TRANSISTOR

(71) Applicant: INTERNATIONAL BUSINESS MACHINES CORPORATION, Armonk, NY (US)

(72) Inventors: Michael P. Belyansky, Halfmoon, NY (US); Cheng Chi, Jersey City, NJ (US); Ekmini Anuja De Silva, Slingerlands, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/703,105

(22) Filed: Sep. 13, 2017

(51) Int. Cl.
  H01L 21/8234 (2006.01)
  H01L 29/66 (2006.01)
  H01L 29/78 (2006.01)
  H01L 21/033 (2006.01)
  H01L 21/02 (2006.01)

(52) U.S. Cl.
  CPC ...... H01L 29/6653 (2013.01); H01L 21/0228 (2013.01); H01L 21/02175 (2013.01); H01L 21/02181 (2013.01); H01L 21/02183 (2013.01); H01L 21/02186 (2013.01);
  (Continued)

(58) Field of Classification Search
  CPC ..... H01L 21/823431; H01L 21/823821; H01L 21/845; H01L 27/0886; H01L 29/6653; H01L 21/02189; H01L 21/02183; H01L 21/02175; H01L 21/02181; H01L 21/0228;
  (Continued)

(56) References Cited

U.S. PATENT DOCUMENTS 7,683,428 B2   3/2010   Chidambarrao et al.
9,368,512 B1 *  6/2016   Cheng ............... H01L 27/1211
(Continued)

FOREIGN PATENT DOCUMENTS

KR   20090117793 A   11/2009

OTHER PUBLICATIONS

Francois-Saint-Cyr et al., "Diffusion of 18 elements implanted into thermally grown SiO2", Journal of Applied Physics, vol. 94, No. 12, Dec. 15, 2003, 8 pages.
(Continued)

Primary Examiner — Bitew A Dinke
(74) Attorney, Agent, or Firm — Michael A. Petrocelli (57) ABSTRACT

A method of forming a semiconductor structure includes forming a protective liner comprising a metal oxide above and in direct contact with a semiconductor substrate, a fin extending upward from the semiconductor substrate and a NON hardmask positioned on top of the fin, removing the protective liner from top surfaces of the semiconductor substrate and NON hardmask, the protective liner remaining on sidewalls of the fin and the NON hardmask, depositing a first dielectric layer, simultaneously removing top portions of the first dielectric layer and NON hardmask, the first dielectric layer remains in direct contact with a bottom portion of the protective liner and the semiconductor substrate, removing the protective liner, the removing of the protective liner creates an opening between the first dielectric layer and the bottom portion of the fin that is subsequently filled with a second dielectric layer.

17 Claims, 4 Drawing Sheets

(52) U.S. Cl.
CPC .... *H01L 21/02189* (2013.01); *H01L 21/0332* (2013.01); *H01L 29/66666* (2013.01); *H01L 29/7827* (2013.01)

(58) Field of Classification Search
CPC ........... H01L 21/0332; H01L 29/66666; H01L 29/7827; H01L 21/02186
See application file for complete search history.

(56) References Cited

U.S. PATENT DOCUMENTS

| | | |
|---|---|---|
| 9,368,572 B1 | 6/2016 | Cheng et al. |
| 9,530,700 B1 | 12/2016 | Mallela et al. |
| 9,716,170 B1* | 7/2017 | Cheng ................. H01L 29/7827 |
| 2011/0012085 A1 | 1/2011 | Deligianni et al. |
| 2013/0037879 A1* | 2/2013 | Filippini ........... H01L 21/31111 257/330 |
| 2014/0117462 A1* | 5/2014 | Cheng ............... H01L 29/66803 257/410 |
| 2014/0159167 A1* | 6/2014 | Basker .............. H01L 29/66795 257/410 |
| 2017/0018624 A1* | 1/2017 | Sun .................... H01L 29/42392 |
| 2017/0053836 A1* | 2/2017 | Park ................. H01L 21/823821 |
| 2018/0166319 A1* | 6/2018 | Park ................... H01L 21/7682 |

OTHER PUBLICATIONS

Hocine et al., "Titanium diffusion in silicon", Appl. Phys. Lett. 53 (14), Oct. 3, 1988, American Institute of Physics, 4 pages.
Larrieu et al., "Vertical nanowire array-based field effect transistors for ultimate scaling†", Nanoscale, Paper, RSCPublishing, Published on Jan. 23, 2013 on http://pubs.rsc.org | doi:10.1039/C3NR33738C, 6 pages.

* cited by examiner

UNIFORM BOTTOM SPACER FOR VERTICAL FIELD EFFECT TRANSISTOR

BACKGROUND

The present invention generally relates to semiconductor devices, and more particularly to vertical field effect transistors (VFETs).

Field effect transistors (FETs) are typically formed on semiconductor substrates and include a channel region disposed between source and drain regions, and a gate configured to electrically connect the source and drain regions through the channel region. Structures where the channel region is parallel to the main surface of the substrate are referred to as planar FET structures, while structures where the channel region is perpendicular to the main surface of the substrate are referred to as vertical FETs (VFETs). Thus, in a VFET device the direction of the current flow between the source and drain regions is normal (perpendicular) to the main surface of the substrate.

A typical VFET device includes a vertical fin or nanowire that extends upward from the substrate. The fin or nanowire forms the channel region of the transistor. A source region and a drain region are situated in electrical contact with the top and bottom ends of the channel region, while the gate is disposed on one or more of the fin or nanowire sidewalls.

SUMMARY

According to an embodiment of the present disclosure, a method of forming a semiconductor structure may include forming a protective liner above and in direct contact with a semiconductor substrate, a fin extending upward from the semiconductor substrate and a nitride-oxide-nitride hardmask positioned on top of the fin, the protective liner includes a metal oxide material, removing the protective liner from a top surface of the semiconductor substrate and a top surface of the nitride-oxide-nitride hardmask, the protective liner remains on sidewalls of the fin and the nitride-oxide-nitride hardmask, forming a first dielectric layer above and in direct contact with the semiconductor substrate, the protective liner and the top surface of the nitride-oxide-nitride hardmask, simultaneously removing top portions of the first dielectric layer and the nitride-oxide-nitride hardmask, the first dielectric layer remains in direct contact with a bottom portion of the protective liner and the semiconductor substrate, removing the protective liner from the semiconductor structure, the removing of the protective liner creates an opening between the first dielectric layer and the bottom portion of the fin, and forming a second dielectric layer, the second dielectric layer fills the opening between the first dielectric layer and the bottom portion of the fin.

According to another embodiment of the present disclosure a method of forming a semiconductor structure may include forming a fin extending upward from a semiconductor substrate, forming a nitride-oxide-nitride hardmask above and in direct contact with the fin, the nitride-oxide-nitride hardmask including a first layer in direct contact with the fin, a second layer above and in direct contact with the first layer, and a third layer above and in direct contact with the second layer, conformally depositing a protective liner above and in direct contact with the semiconductor substrate and the fin, the protective liner including a metal oxide material, removing the protective liner from a top surface of the semiconductor substrate and a top surface of the third layer of the nitride-oxide-nitride hardmask, the protective liner remains on sidewalls of the fin and the nitride-oxide-nitride hardmask, depositing a first dielectric layer above and in direct contact with the semiconductor substrate, the protective liner and the top surface of the third layer, simultaneously removing top portions of the first dielectric layer and the third layer of the nitride-oxide-nitride hardmask, the first dielectric layer and the third layer include substantially similar materials, wherein the first dielectric layer remains in direct contact with a bottom portion of the protective liner and the semiconductor substrate, removing the protective liner from the semiconductor structure, the removing of the protective liner creates an opening between the first dielectric layer and the bottom portion of the fin, conformally depositing a second dielectric layer, the second dielectric layer fills the opening between the first dielectric layer and the bottom portion of the fin, and etching the second dielectric layer until a top surface of the second dielectric layer is coplanar with a top surface of the first dielectric layer such that a thickness of the first dielectric layer and a thickness of the second dielectric layer are substantially the same, the first dielectric layer and the second dielectric layer comprise a bottom spacer.

According to another embodiment of the present disclosure a semiconductor structure may include a fin extending upward from a semiconductor substrate, a hardmask above and in direct contact with the fin, the hardmask comprising a first layer in direct contact with the fin and a second layer above and in direct contact with the first layer, a first dielectric layer above and in direct contact with the semiconductor substrate, and a second dielectric layer interpose between the first dielectric layer and a bottom portion of the fin, a top surface of the second dielectric layer is coplanar with a top surface of the first dielectric layer such that a thickness of the first dielectric layer and a thickness of the second dielectric layer are substantially the same, the first dielectric layer and the second dielectric layer form a bottom spacer.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

In conventional FinFET structures, spacers are formed along sidewalls of the device gate to separate source and drain from the gate region. Nitride-based spacers are generally preferred since they can be easily formed by conformal deposition followed by anisotropic etch.

VFET devices generally include a vertical fin extending upward from the substrate which forms the channel region of the transistor. Source and drain regions are formed at the top and bottom ends of the fin (e.g., channel region), while the gate is disposed on the fin sidewalls. Sidewall spacers are formed in contact with the bottom or lower portion of the fins to separate source drain regions from the gate. A thickness of the sidewall spacers at the bottom of the fins may also set the position of the device junction. Usually, in VFETs, the gate length is defined by a height of the remaining gate metal after recessing, and if the top level of the recessed gate metal is fixed, a varying thickness of the bottom spacers may cause a varying gate length which may negatively impact the performance of the semiconductor device.

The traditional process of conformally depositing a spacer material followed by anisotropic etch is not suitable to form the sidewall spacers (hereinafter "spacers") only at the bottom portion of the fins with a uniform thickness. Additionally, since the hardmask material is usually the same as the spacer material (e.g., silicon nitride), anisotropic etching techniques can easily damage the hardmask stack on top of the fins during formation of the spacers.

Thus, a protective liner may be necessary to form uniform bottom spacers while protecting the hardmask stack. However, typical materials, such as silicon dioxide ($SiO_2$) do not provide enough selectivity to SiN, as such, the hardmask stack may still be damaged during stripping of the $SiO_2$ liner. For example, a possible solution may include depositing a conformal SiN layer on the substrate covering the fin and hardmask stack, followed by a SiCoNi etch to form the bottom spacer. In this scenario, the hardmask stack is considerably damaged and sometimes compromised during the SiCoNi etch.

Consequently, the formation of spacers having a uniform thickness exclusively at the bottom portion of the fins while protecting the hardmask stack may be unattainable in current process of record (POR).

Embodiments of the present disclosure may include a method to form a titanium dioxide liner on the VFET device. The titanium dioxide liner (e.g., protective liner) may protect the hardmask stack (previously formed on the fin) during deposition of the silicon nitride layer and allow the formation of a bottom spacer of uniform thickness after its removal.

Therefore, by forming a protective liner in direct contact with sidewalls of a plurality of fins and a hardmask stack located on top of the plurality of fins, embodiments of the present disclosure may, among other potential benefits, allow the formation of a spacer at the bottom portion of the plurality of fins having a substantially uniform thickness while keeping the hardmask stack undamaged.

The present invention generally relates to semiconductor devices, and more particularly to vertical field effect transistors (VFETs) having a bottom spacer of uniform thickness. One way to form the bottom spacer may include forming a protective liner on sidewalls of the plurality of fins and the hardmask stack on top of the plurality of fins prior to deposition of a silicon nitride spacer material. One embodiment by which the protective liner may be formed is described in detailed below by referring to the accompanying drawings in FIGS. 1-8.

Figure 1:
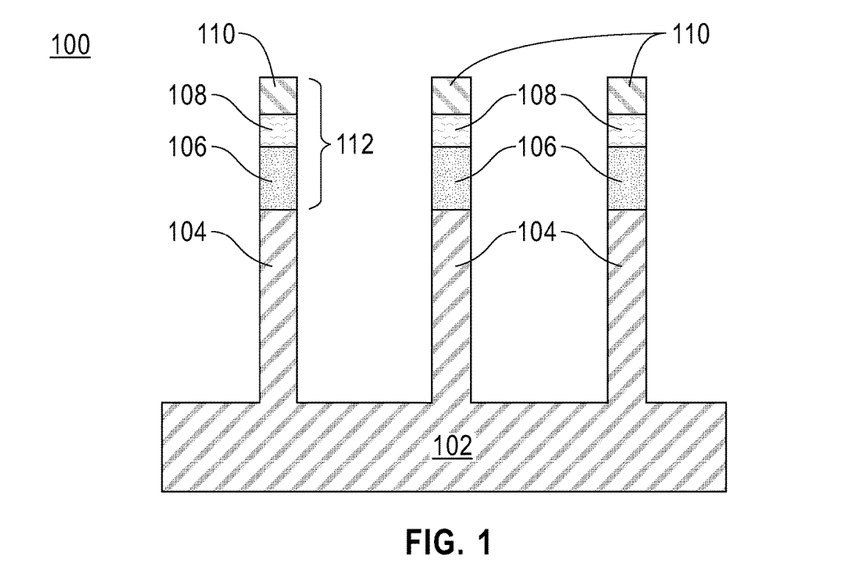
FIG. 1 depicts forming a plurality of fins in a semiconductor structure, according to an embodiment of the present disclosure.

Referring now to FIG. 1, a semiconductor structure 100 may be formed or provided, according to an embodiment of the present disclosure. In the depicted embodiment, the semiconductor structure 100 may include a VFET device. At this step of the manufacturing process, a plurality of fin structures 104 (hereinafter "fins") may be formed from a substrate 102 of the semiconductor structure 100.

In an embodiment, the substrate 102 may be a bulk semiconductor substrate which may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. In this embodiment, the substrate 102 may be made of silicon. In embodiments in which the substrate 102 is a bulk semiconductor substrate, the substrate 102 may have a thickness varying from approximately 0.1 μm to approximately 750 μm.

In another embodiment, the substrate 102 may be a semiconductor-on-insulator (SOI) substrate, where a buried insulator layer separates a base substrate from a top semiconductor layer (not shown). The components of the semiconductor structure 100, including the fins 104, may generally be formed in the top semiconductor layer. In embodiments in which the substrate 102 is an SOI substrate, the substrate 102 may typically have a thickness varying from approximately 5 nm to approximately 100 nm.

A nitride-oxide-nitride (NON) hardmask 112 may be formed above and in direct contact with the substrate 102. The NON hardmask 112 is a multiple-layer hardmask typically formed by a first layer 106 located above and in direct contact with the substrate 102, a second layer 108 located above and in direct contact with the first layer 106, and a third layer 110 above and in direct contact with the second layer 108. Generally, the NON hardmask 112 may be formed to prevent fin erosion during spacer pull down. In this embodiment, the top nitride layer (e.g., third layer 110) of the NON hardmask 112 may function as a sacrificial layer to protect underlying oxide and nitride layers (first layer 106 and second layer 108) during removal of subsequently formed dielectric layers.

Non-limiting examples of materials for forming the first layer 106, second layer 108 and third layer 110 may include silicon dioxide, silicon nitride, tetraethylorthosilicate (TEOS) oxide, high aspect ratio plasma (HARP) oxide, high temperature oxide (HTO), high density plasma (HDP) oxide, or any combination thereof. In this embodiment, the first layer 106 and the third layer 110 of the NON hardmask 112 may include silicon nitride (SiN), while the second layer 108 may include silicon dioxide ($SiO_2$).

The first layer 106, second layer 108 and third layer 110 of the NON hardmask 112 may be formed above the substrate 102 by any deposition method known in the art including, for example, chemical vapor deposition (CVD), physical vapor deposition (PVD), plasma enhanced CVD (PECVD), atomic layer deposition (ALD), evaporation, chemical solution deposition, and/or other like processes. The first layer 106, second layer 108 and third layer 110 may each have a thickness varying from approximately 10 nm to approximately 100 nm.

The fins 104 may be formed from the substrate 102 using known photolithography and etch processes. It should be noted that, during formation of the fins 104, the first layer 106, second layer 108 and third layer 110 may also be patterned such that the NON hardmask 112 remains on top of each fin 104 as shown in the figure.

In an exemplary embodiment, the fins 104 may be formed using a sidewall image transfer (SIT) technique. In such embodiments, the patterning process may include formation of a spacer material (not shown) on sidewall surfaces of a mandrel structure (not shown). The spacer may typically include a material that has a different etch selectivity than the mandrel structure. After spacer formation, the mandrel structure is removed by etching, and then each spacer material may be used as a hardmask or pattern to be used in a subsequent etching process to define the fins 104.

It should be noted that, while the embodiment depicted in FIG. 1 includes three fins 104, any number of fins may be formed from the substrate 102. Typically, the fins 104 may have a height ranging from approximately 5 nm to approximately 200 nm, a width ranging from approximately 5 nm to approximately 25 nm and may be separated by a pitch ranging from approximately 20 nm to approximately 100 nm.

Figure 2:
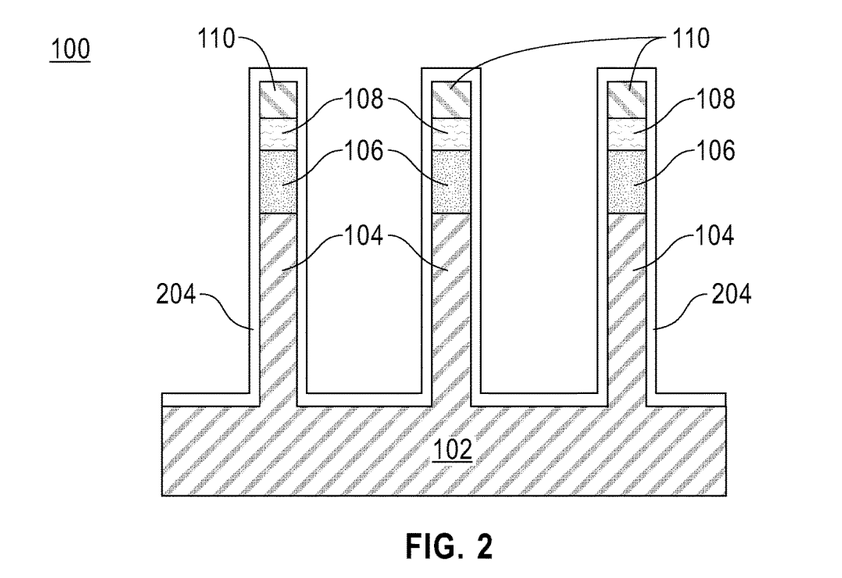
FIG. 2 depicts depositing a protective liner, according to an embodiment of the present disclosure.

Referring now to FIG. 2, a protective liner 204 may be formed on the semiconductor structure 100, according to an embodiment of the present disclosure. More specifically, the protective liner 204 may be conformally deposited above and in direct contact with the substrate 102, the fins 104 and the NON hardmask 112 (FIG. 1). Stated differently, the protective liner 204 may be formed along a perimeter formed by top surfaces of the substrate 102, top surface of the third layer 110 and sidewalls of the fins 104 and NON hardmask 112 (FIG. 1). The protective liner 204 may function as a protective barrier to preserve the NON hardmask 112 during removal of subsequently formed dielectric layers.

The protective liner 204 may preferably be formed from any metal oxide capable of being deposited using atomic layer deposition (ALD) and removed (strippable) by a Standard Cleaning 1 (SC1) solution. Deposition by ALD may enable conformal deposition of the protective liner 204 with good thickness control. The protective liner 204 may provide enough selectivity with respect to the NON hardmask 112 (FIG. 1), specifically the third layer 110 (SiN), such that, by using the SC1 solution, the protective liner 204 may be removed while keeping the NON hardmask 112 (FIG. 1) intact. It should be noted that other deposition and removal techniques may also be considered.

Non-limiting examples of materials for forming the protective liner 204 may include titanium dioxide ($TiO_2$), titanium nitride (TiN), titanium oxycarbide (TiCO), titanium oxynitride (TiON), titanium oxycarbon nitride (TiOCN), hafnium oxide ($HfO_2$), tungsten oxide ($WO_3$), tantalum oxide ($Ta_2O_5$), zirconium dioxide ($ZrO_2$) and/or other like materials. In this embodiment, the protective liner 204 may include titanium dioxide.

Typically, the protective liner 204 may have a thickness varying from approximately 1 nm to approximately 5 nm. In this embodiment, the protective liner 204 may have a thickness of approximately 1-2 nm. It should be noted that a protective liner 204 that is excessively thin (<1 nm) may not efficiently protect the NON hardmask 112 (FIG. 1), while a protective liner 204 that is excessively thick (>5 nm) may not be suitable for scaling purposes and degrade manufacturing efficiency.

It should be noted that, typically ALD-deposited $SiO_2$ is used as protective liner. In such cases, the $SiO_2$ protective liner does not provide enough selectivity to SiN resulting in fin and hardmask damage during subsequent removal processes.

Figure 3:
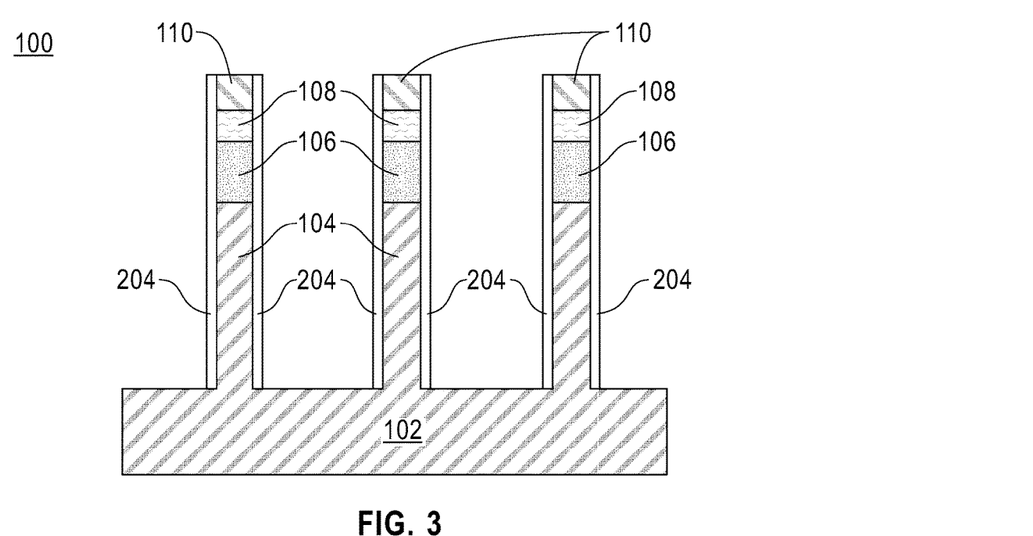
FIG. 3 depicts etching the protective liner, according to an embodiment of the present disclosure.

Referring now to FIG. 3, top and bottom portions of the protective liner 204 may be removed from the semiconductor structure 100, according to an embodiment of the present disclosure. More specifically, portions of the protective liner 204 parallel to the substrate 102 may be removed from the semiconductor structure 100.

In this embodiment, an anisotropic etching technique may be used to remove top and bottom portions of the protective liner 204. By performing an anisotropic etch, the protective liner 204 may be selectively removed from top surfaces of the substrate 102 and third layer 110 only, while remaining on opposite sidewalls of the fins 104 and NON hardmask 112 (FIG. 1).

Figure 4:
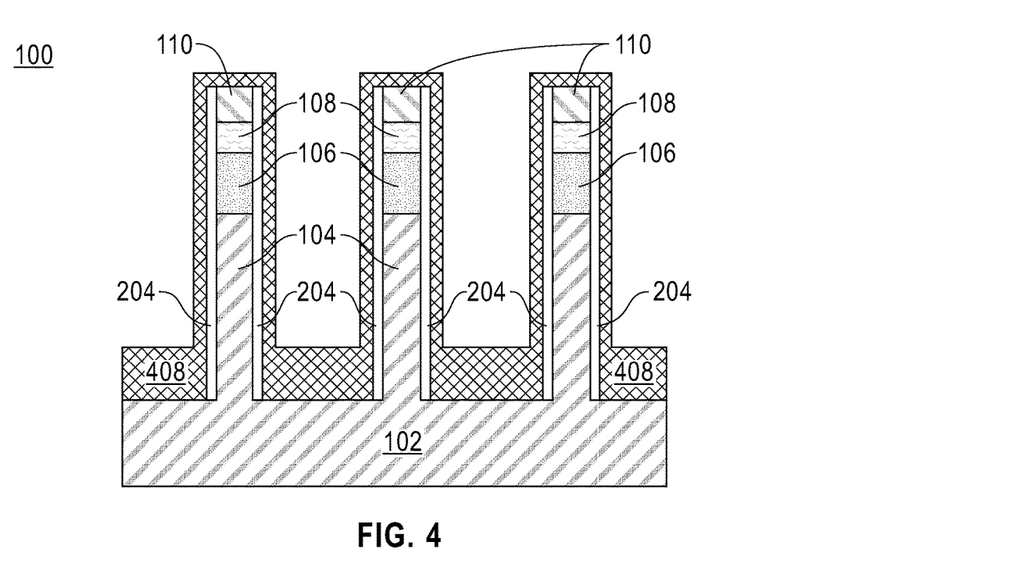
FIG. 4 depicts forming a first dielectric layer, according to an embodiment of the present disclosure.

Referring now to FIG. 4, a first dielectric layer 408 may be formed on the semiconductor structure 100, according to an embodiment of the present disclosure. The first dielectric layer 408 may subsequently form a uniform bottom spacer located directly on top of the substrate 102 between the fins 104. As shown in the figure, the first dielectric layer 408 may be deposited above and in direct contact with the substrate 102, the protective liner 204 and a top surface of the third layer 110.

The first dielectric layer 408 may include a dielectric material such as silicon oxide, silicon nitride, silicon oxynitride, a low-k material, or any combination thereof. In this embodiment, the first dielectric layer 408 may be formed by depositing a layer of silicon nitride using, for example, a directional High-Density Plasma CVD (HDPCVD). It should be noted that HDPCVD may allow for the silicon nitride of the first dielectric layer 408 to accumulate and form a thicker portion on top of the substrate 102 between the fins 104. In some embodiments, such accumulation of the silicon nitride of the first dielectric layer 408 is desirable because it assists in the formation of a uniform spacer on top of the substrate 102 between the fins 104, described in more detail below.

Additionally, accumulation of the silicon nitride of the first dielectric layer 408 may allow for easier control over the thickness of the uniform spacer. Although possible, the first dielectric layer 408 may preferably not be formed using conformal deposition techniques because in order to achieve sufficient thickness on top of the substrate 102 between the fins 104 would result in excess material along surfaces of both the fins 104 and the NON hardmask 112 (FIG. 1). Doing so would necessitate a delicate removal technique to remove the excess along surfaces of both the fins 104 and the NON hardmask 112 (FIG. 1) while trying to maintain sufficient thickness on top of the substrate 102 between the fins 104.

It should be noted that remaining portions of the protective liner 204 located along sidewalls of the fins 104 and NON hardmask 112 (FIG. 1) may function as a spacer during deposition of the first dielectric layer 408, thus preventing the first dielectric layer 408 from contacting the sidewalls of the fins 104 and NON hardmask 112 (FIG. 1).

Typically, the portion of the first dielectric layer 408 on top of the substrate 102 between the fins 104 may preferably have a thickness varying from approximately 5 nm to approximately 20 nm. In this embodiment, the first dielectric layer 408 may have a thickness of approximately 8 nm. If the thickness of the portion of the first dielectric layer 408 on top of the substrate 102 between the fins 104 is less than 5 nm then high capacitance between gate and bottom source may result. Conversely, if the thickness of the portion of the first dielectric layer 408 on top of the substrate 102 between the fins 104 exceeds 20 nm then high resistance and low current may result in the semiconductor structure 100.

Figure 5:
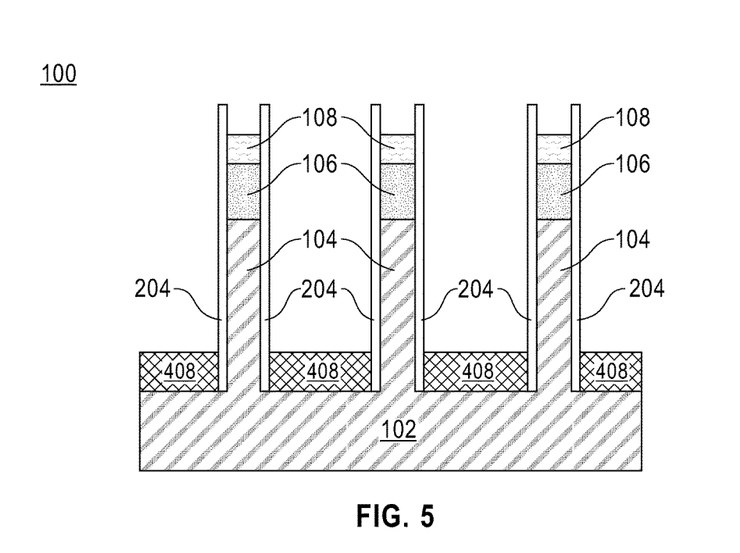
FIG. 5 depicts etching the first dielectric layer, according to an embodiment of the present disclosure.

Referring now to FIG. 5, etching the first dielectric layer 408 is shown, according to an embodiment of the present disclosure. Specifically, upper portions of the first dielectric layer 408 may be removed such that the first dielectric layer 408 remains above and in direct contact with the substrate 102 between the fins 104. Additionally, the remaining portion of the first dielectric layer 408 is in direct contact with and extends from the protective liner 204 along one fin 104 to the protective liner 204 along an adjunct fin 104, as shown in the figure. In addition to removing portions of the first dielectric layer 408 along surfaces of both the fins 104 and the NON hardmask 112 (FIG. 1), in some embodiments, remaining portions of the first dielectric layer 408 between the fins 104 may be etched further until reaching a desired thickness. In other embodiments, the remaining portions of the first dielectric layer 408 may be etched to their desired thickness later in the process, as is described below with respect to FIG. 8.

In this embodiment, etching of the first dielectric layer 408 may also include simultaneously etching (removing) the third layer 110 (FIG. 4) of the NON hardmask 112 (FIG. 1). As mentioned above, the third layer 110 (FIG. 4) and the first dielectric layer 408 may include the same or similar material (e.g., silicon nitride) thus simplifying their removal using the same etch chemistries.

The upper portions of the first dielectric layer 408 and the third layer 110 (FIG. 4) may be selectively removed by, for example, a reactive ion etching technique. In some embodiments, wet-chemical etching and cleaning may be used to remove the first dielectric layer 408 from sidewalls of the protective liner 204 and the third layer 110 (FIG. 4) from the NON hardmask 112 (FIG. 1).

As previously noted above, the third layer 110 (FIG. 4) may act as a sacrificial layer to protect the remaining layers (e.g., second layer 108 and first layer 106) of the NON hardmask 112 (FIG. 1) during etching of the protective liner 204 and the first dielectric layer 408. It should be noted that removal of the third layer 110 (FIG. 4) exposes the second layer 108 of the NON hardmask 112.

Figure 6:
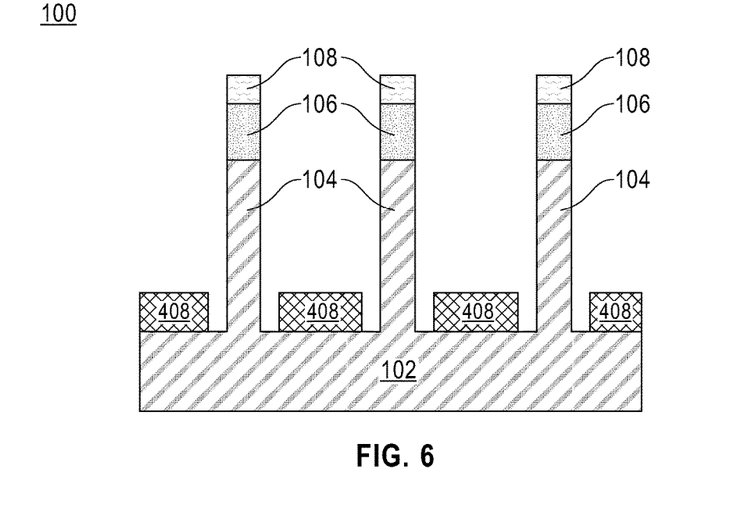
FIG. 6 depicts removing the protective liner, according to an embodiment of the present disclosure.

Referring now to FIG. 6, remaining portions of the protective liner 204 may be completely removed from the semiconductor structure 100, according to an embodiment of the present disclosure. As mentioned above, the protective liner 204 may include a material strippable by an SC1 solution. As such, in this embodiment, a SC1 solution may be used to remove the protective liner 204.

An SC1 solution may generally consist of 5 parts of deionized water, 1 part of aqueous $NH_4OH$ (ammonium hydroxide, 29% by weight of $NH_3$), and 1 part of aqueous $H_2O_2$ (hydrogen peroxide, 30%). This peroxide-based mixture may be typically used to remove organic residues without damage to the underlying layers. It should be noted that the SC1 solution may be more benign that HF-based chemistries which may attack $SiO_2$ and metal layers or substrates.

By removing the protective liner 204, a plurality of openings (hereinafter "openings") may be formed between the remaining portions of the first dielectric layer 408 and bottom portions of the fins 104, as shown in the figure. These openings may be subsequently filled with a dielectric material, forming, together with the first dielectric layer 408, the uniform bottom spacer of substantially unvarying thickness, as will be described in detailed below.

Figure 7:
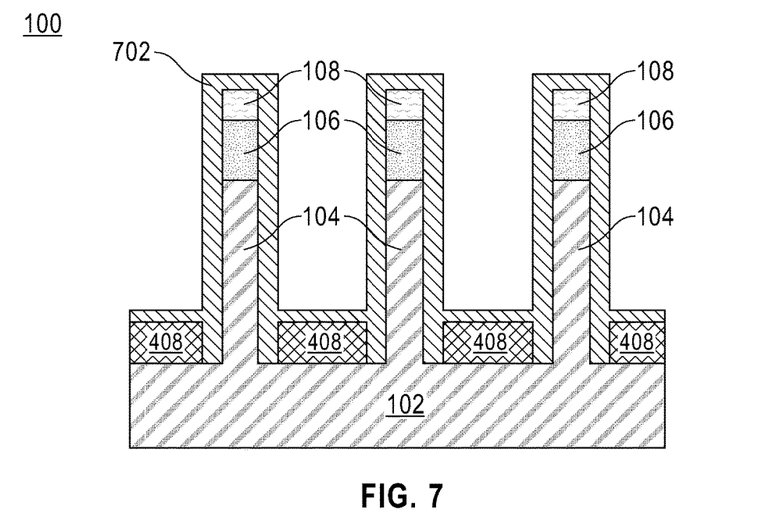
FIG. 7 depicts forming a second dielectric layer, according to an embodiment of the present disclosure.

Referring now to FIG. 7, a second dielectric layer 702 may be formed on the semiconductor structure 100, according to an embodiment of the present disclosure. The second dielectric layer 702 may be conformally deposited on the semiconductor structure 100. The second dielectric layer 702 may preferably fill the openings created by removing the remaining portions of the protective liner 204 (FIG. 6) between the first dielectric layer 408 and the fins 104.

The second dielectric layer 702 may include a dielectric material such as silicon oxide, silicon nitride, silicon oxynitride, a low-k material, or any combination thereof. In this embodiment, the second dielectric layer 702 may include silicon oxycarbide (SiCO).

The second dielectric layer 702 may be formed by any suitable deposition method known in the art. In some embodiments, the second dielectric layer 702 may be formed by ALD deposition.

Typically, the second dielectric layer 702 may have a thickness varying from approximately 1 nm to approximately 5 nm. In this embodiment, the second dielectric layer 702 may have a thickness of approximately 1-2 nm. The exact thickness is not as critical as adequate coverage sufficient to fill the openings between the remaining portions of the first dielectric layer 408 and bottom portions of the fins 104.

Figure 8:
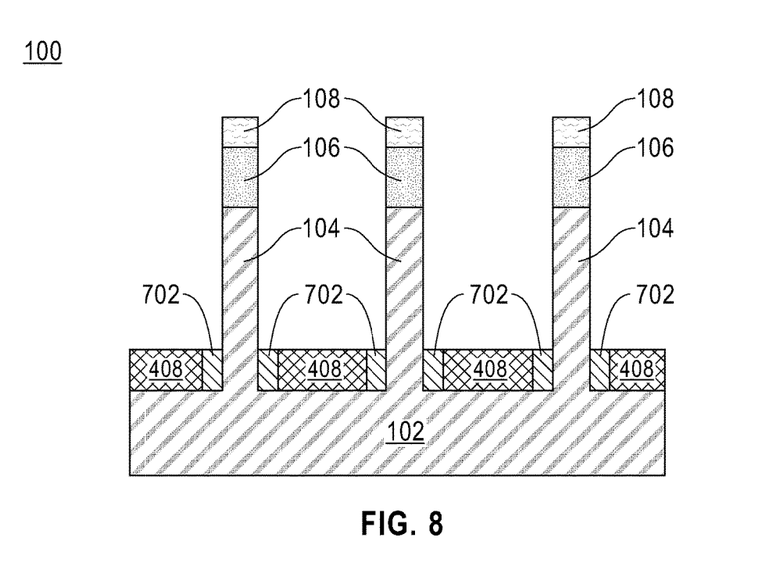
FIG. 8 depicts etching the second dielectric layer, according to an embodiment of the present disclosure.

Referring now to FIG. 8, upper portions of the second dielectric layer 702 may be recessed or removed, according to an embodiment of the present disclosure. As shown in the figure, the upper portions of the second dielectric layer 702 may be removed to exposed sidewalls of the fins 104, sidewalls of the third layer 110 and the second layer 108.

Remaining portions of the second dielectric layer 702 may be in direct contact with a bottom portion of the fins 104 and the first dielectric layer 408.

More specifically, the second dielectric layer 702 may be etched until a top surface of the second dielectric layer 702 is coplanar or substantially flush with a top surface of the first dielectric layer 408 as shown in the figure. In most embodiments, consequently, the uniform bottom spacer consisting of the first dielectric layer 408 and the second dielectric layer 702 may be formed in direct contact with bottom portions of the fins 104 having a substantially uniform thickness. As referenced above, and in some embodiments, the first dielectric layer 408 may be further recessed simultaneously while etching the second dielectric layer 702 such that the top surface of the second dielectric layer 702 is flush with the top surface of the first dielectric layer 408. The second dielectric layer 702 may be selectively removed by, for example, a reactive ion etching technique.

Therefore, by forming the protective liner 204 in direct contact with sidewalls of the fins 104, prior to the deposition of the first dielectric layer 408, a bottom sidewall spacer having a substantially uniform thickness may be formed in the semiconductor structure 100 while preserving the first layer 106 and the second layer 108 of the NON hardmask 112 (FIG. 1). The bottom spacer consisting of coplanar portions of the first dielectric layer 408 and the second dielectric layer 702.

Embodiments of the present disclosure may include a method of forming a uniform bottom spacer for a vertical channel transistor, the method including the steps of: forming a multiplicity of vertical fins on a silicon substrate using a NON hardmask stack; depositing a titanium dioxide layer using an ALD process to conformably cover the fins and the substrate and etching it to form a titanium dioxide sidewall spacer; depositing a HDP silicon nitride layer and performing a silicon nitride spacer etch while removing the top silicon nitride layer of the NON hardmask stack; selectively etching the titanium dioxide layer; filling back with a silicon oxycarbide, silicon nitride or silicon dioxide material and etching back to form a replacement spacer portion in the divot between the fin and the HDP silicon nitride bottom spacer to complete the dual material spacer structure while retaining the nitride/oxide hardmask on the fin to facilitate the completion of the downstream VFET fabrication steps.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, the method comprising:
    forming a protective liner above and in direct contact with a semiconductor substrate, a fin extending upward from the semiconductor substrate and a nitride-oxide-nitride hardmask positioned on top of the fin, wherein the protective liner comprises a metal oxide material;
    removing the protective liner from a top surface of the semiconductor substrate and a top surface of the nitride-oxide-nitride hardmask, wherein the protective liner remains on sidewalls of the fin and the nitride-oxide-nitride hardmask;
    forming a first dielectric layer above and in direct contact with the semiconductor substrate, the protective liner and the top surface of the nitride-oxide-nitride hardmask;
    simultaneously removing top portions of the first dielectric layer and the nitride-oxide-nitride hardmask, wherein the first dielectric layer remains in direct contact with a bottom portion of the protective liner and the semiconductor substrate;
    removing the protective liner from the semiconductor structure, wherein removing the protective liner creates an opening between the first dielectric layer and the bottom portion of the fin; and
    forming a second dielectric layer, the second dielectric layer fills the opening between the first dielectric layer and the bottom portion of the fin.

2. The method of claim 1, wherein forming the second dielectric layer comprises:
    etching the second dielectric layer until a top surface of the second dielectric layer is coplanar with a top surface of the first dielectric layer such that a thickness of the first dielectric layer and a thickness of the second dielectric layer are substantially the same.

3. The method of claim 1, wherein the nitride-oxide-nitride hardmask comprises a first layer directly above the fin, a second layer interpose between the first layer and a third layer, the third layer directly above the second layer, wherein the first layer and the third layer comprise silicon nitride (SiN) and the second layer comprises silicon dioxide (SiO2).

4. The method of claim 1, wherein the metal oxide material is capable of being deposited using atomic layer deposition (ALD) and removed by a Standard Cleaning 1 (SC1) solution.

5. The method of claim 1, wherein the protective liner has a thickness varying from approximately 1 nm to approximately 5 nm.

6. The method of claim 1, wherein the metal oxide material comprises titanium dioxide ($TiO_2$), titanium nitride (TiN), titanium oxycarbide (TiCO), titanium oxynitride (TiON), titanium oxycarbon nitride (TiOCN), hafnium oxide ($HfO_2$), tungsten oxide ($WO_3$), tantalum oxide ($Ta_2O_5$), or zirconium dioxide ($ZrO_2$).

7. The method of claim 1, wherein forming the first dielectric layer comprises using a directional deposition method such that a thickness of the first dielectric layer above the semiconductor substrate and in contact with the bottom portion of the fin is larger than a thickness of a top portion of the first dielectric layer.

8. The method of claim 7, wherein the directional deposition method comprises a High-Density Plasma CVD.

9. The method of claim 1, wherein the second dielectric layer comprises silicon oxycarbide, silicon oxide, silicon nitride, silicon oxynitride, a low-k material, or any combination thereof.

10. A method of forming a semiconductor structure, the method comprising:
    forming a fin extending upward from a semiconductor substrate;
    forming a nitride-oxide-nitride hardmask above and in direct contact with the fin, the nitride-oxide-nitride hardmask comprising a first layer in direct contact with the fin, a second layer above and in direct contact with the first layer, and a third layer above and in direct contact with the second layer;

conformally depositing a protective liner above and in direct contact with the semiconductor substrate and the fin, the protective liner comprising a metal oxide material;

removing the protective liner from a top surface of the semiconductor substrate and a top surface of the third layer of the nitride-oxide-nitride hardmask, wherein the protective liner remains on sidewalls of the fin and the nitride-oxide-nitride hardmask;

depositing a first dielectric layer above and in direct contact with the semiconductor substrate, the protective liner and the top surface of the third layer;

simultaneously removing top portions of the first dielectric layer and the third layer of the nitride-oxide-nitride hardmask, the first dielectric layer and the third layer comprise substantially similar materials, wherein the first dielectric layer remains in direct contact with a bottom portion of the protective liner and the semiconductor substrate;

removing the protective liner from the semiconductor structure, wherein removing the protective liner creates an opening between the first dielectric layer and the bottom portion of the fin;

conformally depositing a second dielectric layer, the second dielectric layer fills the opening between the first dielectric layer and the bottom portion of the fin; and etching the second dielectric layer until a top surface of the second dielectric layer is coplanar with a top surface of the first dielectric layer such that a thickness of the first dielectric layer and a thickness of the second dielectric layer are substantially the same, wherein the first dielectric layer and the second dielectric layer comprise a bottom spacer.

11. The method of claim 10, wherein the first layer and the third layer of the nitride-oxide-nitride hardmask comprise silicon nitride (SiN) and the second layer comprises silicon dioxide (SiO2).

12. The method of claim 10, wherein the metal oxide material is capable of being deposited using atomic layer deposition (ALD) and removed (strippable) by a Standard Cleaning 1 (SC1) solution.

13. The method of claim 10, wherein the metal oxide material comprises titanium dioxide ($TiO_2$), titanium nitride (TiN), titanium oxycarbide (TiCO), titanium oxynitride (TiON), titanium oxycarbon nitride (TiOCN), hafnium oxide ($HfO_2$), tungsten oxide ($WO_3$), tantalum oxide ($Ta_2O_5$), or zirconium dioxide ($ZrO_2$).

14. The method of claim 10, wherein the protective liner has a thickness varying from approximately 1 nm to approximately 5 nm.

15. The method of claim 10, wherein depositing the first dielectric layer comprises using a directional deposition method such that a thickness of the first dielectric layer above the semiconductor substrate and in contact with the bottom portion of the fin is larger than a thickness of a top portion of the first dielectric layer.

16. The method of claim 15, wherein the directional deposition method comprises a High-Density Plasma CVD.

17. The method of claim 10, wherein the second dielectric layer comprises silicon oxycarbide, silicon oxide, silicon nitride, silicon oxynitride, a low-k material, or any combination thereof.

* * * * *